United States Patent [19]

Bertin et al.

[11] 4,139,935

[45] Feb. 20, 1979

[54] OVER VOLTAGE PROTECTIVE DEVICE AND CIRCUITS FOR INSULATED GATE TRANSISTORS

[75] Inventors: Claude L. Bertin, Oakton; Francisco H. De La Moneda, Reston, both of Va.

[73] Assignee: International Business Machines Corporation, Armonk, N.Y.

[21] Appl. No.: 782,574

[22] Filed: Mar. 29, 1977

Related U.S. Application Data

[63] Continuation of Ser. No. 516,929, Oct. 22, 1974, abandoned.

[51] Int. Cl.² .............................................. H01L 21/26
[52] U.S. Cl. ........................................ 29/571; 148/1.5; 148/187; 357/41; 357/91
[58] Field of Search .................... 148/1.5, 187; 357/41, 357/91; 29/571

[56] References Cited

U.S. PATENT DOCUMENTS

| | | | |
|---|---|---|---|
| 3,390,019 | 6/1968 | Manchester | 148/1.5 |
| 3,534,235 | 10/1970 | Bower et al. | 148/1.5 X |
| 3,571,914 | 3/1971 | Lands et al. | 148/187 X |
| 3,590,340 | 6/1971 | Kubo et al. | 357/41 |
| 3,650,019 | 3/1972 | Robinson | 148/1.5 X |
| 3,679,492 | 7/1972 | Fang et al. | 148/1.5 |
| 3,746,946 | 7/1973 | Clark | 357/41 |
| 3,777,216 | 12/1973 | Armstrong | 317/31 |
| 3,793,088 | 2/1974 | Eckton | 148/1.5 |
| 3,890,163 | 6/1975 | Pruniaux et al. | 148/1.5 |
| 3,999,212 | 12/1976 | Usuda | 357/41 |

OTHER PUBLICATIONS

Fang et al., "Ion Implanted, Bidirectional High Voltage MOSFET," IBM Tech. Disc. Bull., vol. 15, No. 2, 5/73, p. 3884.

*Primary Examiner*—G. Ozaki
*Attorney, Agent, or Firm*—Maurice H. Klitzman

[57] ABSTRACT

Protective devices and circuits for insulated gate transistors are improved by another p/n junction diode or MOS diode preventing breakdown of the thin oxide of the protective device. The breakdown voltage of the protective device or p/n diode may be tailored to a preselected voltage by altering its metallurgical junction by ion implantation or other techniques. Tailoring permits the breakdown voltage of the protective device to be independent of process and circuit specification of a protected or internal circuit. A plurality of parallel circuits connected as a protective device limits or controls secondary breakdown of the protective device.

9 Claims, 26 Drawing Figures

OVER VOLTAGE PROTECTIVE DEVICE AND CIRCUITS FOR INSULATED GATE TRANSISTORS

This is a continuation of application Ser. No. 516,929, filed Oct. 22, 1974, now abandoned.

BACKGROUND OF INVENTION

1. Field of the Invention

This invention relates to semiconductor devices and circuits, and more particularly to protective devices and circuits for preventing breakdown or rupture of the gate oxide of an insulated gate field effect transistor.

2. Description of Prior Art

Protective diodes and gated diodes for insulated gate field effect transistors are well known in the art as evidenced by U.S. Pat. No. 3,403,270 (Pace, et al) and U.S. Pat. No. 3,787,717 (Fisher, et al), respectively. It is also known in the art to protect the thin oxide of a protective device by suitable circuitry as evidenced by U.S. Pat. No. 3,395,290 (Farina, et al) or U.S. Pat. No. 3,746,946 (Clark). It has been found that the thin oxide of a protective device is exposed to greater over voltage stress than the thin oxide of the protected or internal device. Failure of the protective device results in a short circuit between an input terminal and substrate which renders the protected device and/or array inoperative whereas in fact the protected device or array is operative. The prior art does not show how a protective device may be improved to withstand over voltage stress by additional elements or tailoring of metallurgical junctions or limiting or controlling the secondary breakdown effects which are the predominant modes of failure. Reducing the failure modes of protective devices will increase manufacturing yield, lower cost and make the benefits of large scale integration more available to the public.

SUMMARY OF THE INVENTION

Experiments indicate that the cause for failure of protective devices is thin oxide rupture. The power dissipated by electrostatic discharge current flowing through the thin oxide results in burn out which shorts the protective device. One solution for the problem is to limit the current through the thin oxide by means of an impedance element connected between the gate of the protective device and the substrate. A p/n diode provides a high impedance that prevents current flow through the oxide since positive going over voltages drive the diode into a reverse bias or high impedance condition. Another solution is a dynamic impedance that switches from a low impedance to a high impedance level thereby providing good clamping for the protective device at the beginning of a electrostatic current surge and a high impedance to block the surge through the thin oxide as the surge increases. One circuit element that provides a high/low impedance characteristic, as described, is an MOS diode. An alternative to a gated thin oxide as a protective device is to alter the input junction of a protective diode or lateral transistor to provide improved low breakdown voltage to the input surge. The breakdown voltage may be tailored by appropriately shaping the p/n junction through ion implantation and other techniques. Tailoring of a metallurgical junction by ion implantation permits the protective device to be (1) independent of the junction breakdown induced by a gated thin oxide and (2) selectable by a device designer.

A plurality of parallel circuits comprising resistors and gated diodes enables secondary breakdown currents in a protective device to be limited or controlled. The plurality of parallel circuits permits the electrostatic discharge current to be uniformly distributed along the junction thus avoiding high temperatures which induce current conduction through the thin oxide.

A general object of the invention is an improved protective device and circuit for insulated gate transistors.

One object of the invention is a protective device that may be tailored to breakdown at a particular voltage that is independent of process and circuit specifications of a circuit to be protected.

Another object is an impedance element connected to a protective device to lessen the failure modes of a protective device without adversely affecting the performance of a protected circuit.

Still another object is a process for fabricating a protective device which permits the breakdown voltage of the protective device to be tailored to a preselected voltage independent of the device and process specifications for an internal or protected gate(s).

In an illustrative embodiment, a protected circuit including an insulated gate transistor subject to over voltage stress from electrostatic discharge during manufacturing or handling is fabricated in a semiconductor substrate by well known processing steps. A protective device, typically a p/n junction or gated transistor is also fabricated in the substrate. The protective device is appropriately connected to the internal circuits to shunt electrostatic discharge currents through the substrate and/or a reference supply. An impedance element is also fabricated in the substrate and connected to the protective device to prevent breakdown of the thin oxide thereof by electrostatic discharge currents flowing through the protective device. In one form the impedance element may be a p/n or MOS diode that provides a high impedance to block the flow of discharge currents through the thin oxide of the protective device. In another form, the protective device may be a p/n diode and/or a lateral transistor having a junction tailored by ion implantation or other techniques to achieve a breakdown voltage independent of the process and device characteristics of the internal circuit. In still another form the protective device may comprise a plurality of parallel connected resistor-lateral transistor circuits to control secondary breakdown events therein.

BRIEF DESCRIPTION OF THE DRAWING

These and other objects and features of the invention will be more fully apprehended from the following specification taken in conjunction with the appended drawing in which.

DESCRIPTION OF THE PREFERRED EMBODIMENT

Figure 1A:
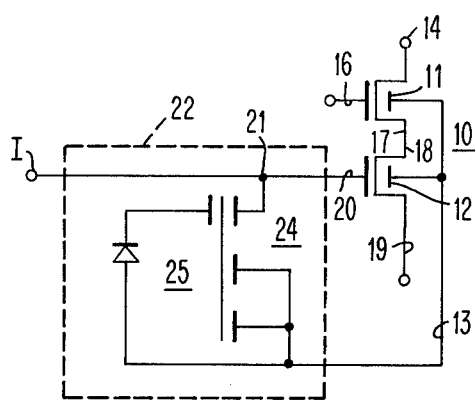
FIG. 1A is an electrical schematic of a protected insulated gate transistor and protective circuit including a gated diode and an impedance element.

FIG. 1A shows an insulated gate inverter circuit 10 or internal or protected circuit comprising a load transistor 11 and a data or gate transistor 12. An electrode 13 is shown as connecting the transistors 11 and 12 to substrate. The load transistor comprises an electrode 14, typically a drain element, a second electrode 16 or gate, and a third electrode 17 or source. The gate transistor 12 comprises a drain electrode 18 connected to the electrode 17, a source electrode 19, and a gate electrode 20 connected to an input terminal (I). The electrodes are biased while the circuit is operating and floating during manufacture of the circuit in semiconductor form.

An over voltage protective circuit 22 is connected between the input terminal (I) and the gate electrode 20 at a node 21. The over voltage protective circuit is adapted to prevent breakdown of gate insulation (not shown) between the gate electrode 20 and the electrode 13 and/or electrode 19. The gate insulation is subject to breakdown during operation or manufacture of the protected circuit, the latter due to electrostatic discharge from humans or manufacturing equipment. The over voltage circuit operates to shunt electrostatic discharge through the substrate thereby shielding the gate insulation of the electrode 20.

Figure 2A:
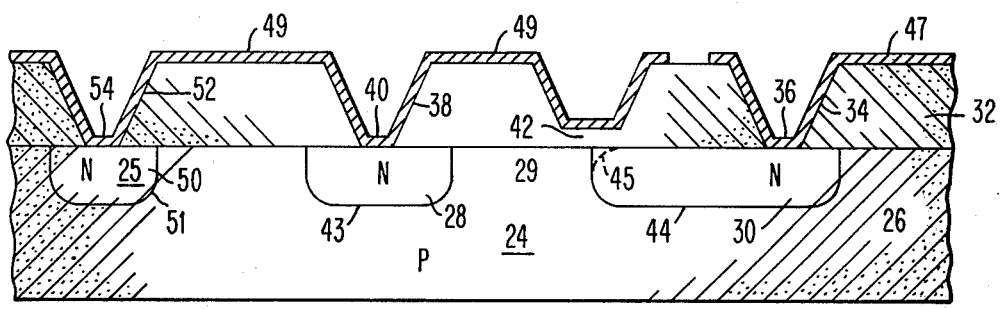
FIG. 2A is a cross sectional view of a semiconductor member showing the configuration of the protective circuit of FIG. 1A.
Figure 2B:
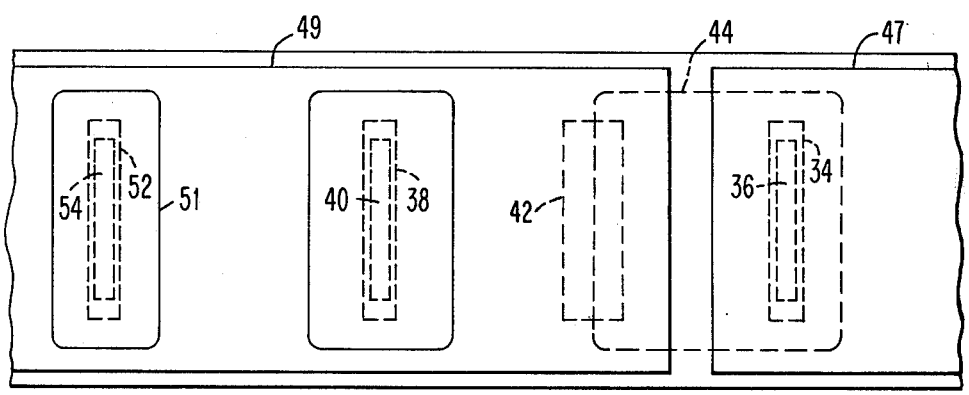
FIG. 2B is a plan view of FIG. 2A.
Figure 3B:
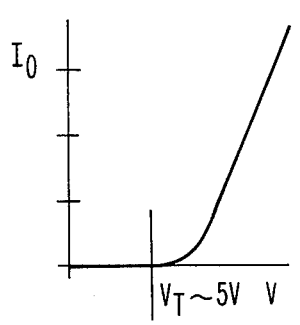
FIG. 3B is a graph of drain current ($I_D$) versus input voltage ($V_i$) of a MOS diode included in the protective circuit of FIG. 1B.
Figure 3A:
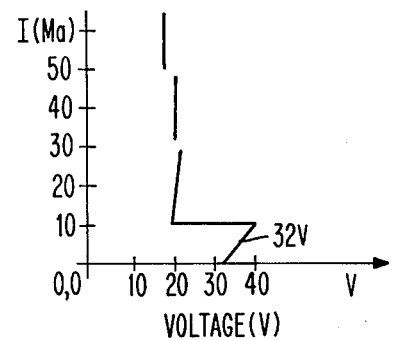
FIG. 3A is a graph of current (I) versus voltage (V) for the gated device of FIG. 1A.

One form of a protective device 22 comprises a gated diode 24, as described in U.S. Pat. No. 3,787,717 and assigned to the same assignee as that of the present invention, and a high impedance element 25, typically a p/n diode. Essentially, the gated diode is a lateral transistor formed in a semiconductor substrate and adapted to have a controlled breakdown of the collector-base junction by means of a field shield, as shown in FIG. 3A and described in U.S. Pat. No. 3,787,717. FIGS. 2A and 2B show the protective circuit of FIG. 1A fabricated in a semiconductor substrate 26 of one conductivity type.

An emitter region 28 and a collector region 30, both of a second conductivity type, are formed in the substrate. An insulating layer 32, typically silicon dioxide or the like overlies the substrate. A first opening 34 is formed in the layer 32 to permit the formation of a collector contact as part of a metal electrode 47, typically aluminum or the like. A second opening 38 is formed in the layer to permit attachment of an emitter contact 40 as part of an metal electrode 49, typically aluminum or the like. The substrate region between the emitter 28 and the collector 30 is a base region 29. A emitter-base junction 43 and a collector-base junction 44 complete the elements of gated diode 24 shown in FIG. 1A. No electrical contact is made to the base region. The layer 32 is appropriately thinned over the collector-base junction 44 to establish a thin oxide layer 42 that controls breakdown of the gated diode. The thickness of the oxide layer 42 corresponds to the thickness of the gate insulation of the device 12 to be protected. The metal electrode 49 extends over the region 42 at 46 to permit the gated diode to achieve an avalanche breakdown voltage substantially below the voltage level that will cause breakdown of the gate dielectric of the protected device.

As noted before, experience indicates the thin oxide layer 42 is subject to greater over voltage stress than the gate insulation for the protected device. Breakdown of the layer 42 is caused by high current flow therethrough due to electrostatic discharge currents from a human or like source. Protection of the layer 42 is achieved by connecting a high impedance element between the electrode 40 and the substrate. A high impedance element limits current flow through the layer 42. One circuit element that provides a high impedance is a reverse biased p/n diode 25, as shown in FIG. 1A. Positive going voltages at the input terminal I drive the diode into reverse bias and provide a high impedance to current flow from electrostatic discharge that would ordinarily cause breakdown of the protective device 24. The diode 25 may be readily fabricated during the manufacture of the gated diode 24.

FIG. 2A shows a diffused region 50 of the same conductivity type as the regions 28 and 30. A junction 51 between the substrate 26 and the region 50 functions as the diode 25 of FIG. 1A. An opening 52 is formed in the layer 32 for attachment of a contact element to the region 50. The electrode 49 is extended into the opening 52 to establish a contact 54. FIG. 2B shows the metal electrode 47 which connects the contact 36 to the protected device at node 21. The metal electrode 49 is shown in FIG. 2B as connecting the diode 51 to the portion 46 of electrode 49 over the thinned oxide region 42 of the gated diode.

The collector-base junction 44 normally directs electrostatic discharge currents to the substrate, as described in U.S. Pat. No. 3,787,717. High voltage stress across the junction 44 causes an electrical alteration 45 near the voltage stress, as is well known in the art. Excess voltage stress is prevented in the layer 42 by reason of the diode 51 preventing the flow of current in the electrode 49 that would otherwise cause breakdown of the region 42.

Figure 1B:
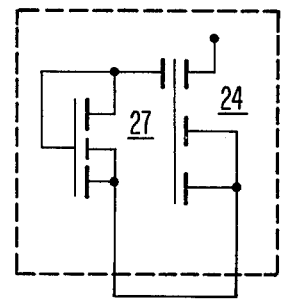
FIG. 1B is an electrical schematic of another protective circuit including a gated diode and another impedance element.

Another embodiment of the invention, as shown in FIG. 1B, substitutes a MOS diode 27 for the diode 25 of FIG. 1A. The diode 27 has a current-voltage characteristic, as shown in FIG. 3B. The diode will turn on for an input voltage exceeding $V_T$ or a threshold voltage. The input voltage to diode 27 is derived from the electrostatic discharge through the capacitive coupling provided by the thin oxide of the device 24. Typically, the diode 27 is adapted to be on for input voltages exceeding 5 volts and to be off for input voltages less than 4 volts. Assuming a capacitive coupling of 6:1 and an input voltage at the diode 24 of 32 volts, as shown in FIG. 3A, the diode 27 is turned on. When turned on, the diode 27 has a lower impedance than the diode 25, when reverse biased. The lower impedance is derived from two conducting paths from the input to the substrate. One conducting path is through the drain substrate junction and the other conducting path to the substrate is through the drain-source path of the diode 27. The lower impedance of the diode 27 relative to the diode 25 provides better clamping of the diode 24 to substrate for transient condition at the input.

As the electrostatic discharge current increases, however, the diode 24 is turned on hard and driven into a lower voltage condition of the order of 20 volts, as shown in FIG. 3A. The diode 27, however, is turned off by reason of the capacitively coupled voltage being reduced to less than the threshold voltage. The diode 27 assumes a high impedance state thereby to block electrostatic discharge currents from flowing through and rupturing the thin oxide region of the diode 24.

Figure 3C:
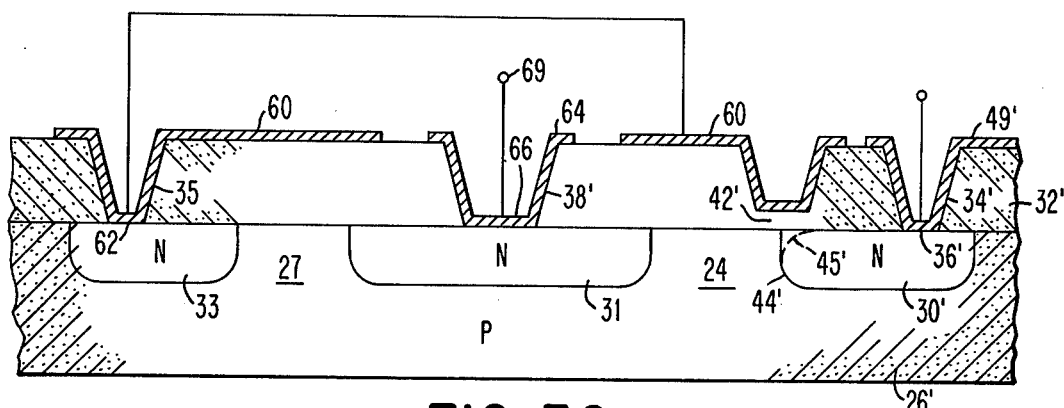
FIG. 3C is a cross sectional view of a semiconductor member showing the configuration of the protective circuit of FIG. 1B.
Figure 3D:
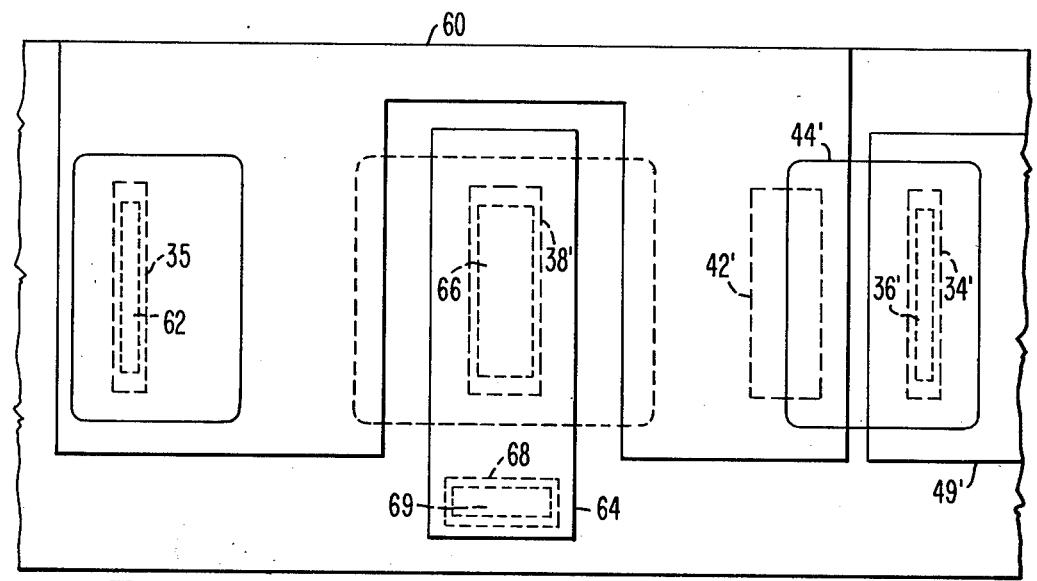
FIG. 3D is a plan view of FIG. 3C.

FIGS. 3C and 3D show the formation of the devices 24 and 27 of FIG. 1B in a semiconductor substrate 26' of one conductivity type. Elements in FIGS. 3C and 3D corresponding to those in FIGS. 2A and 2B have the same reference designation except they are primed. The first diffused region 30' of a second conductivity type forms a collector for the protective device 24 of FIG. 1B. A second diffused region of the second conductivity type forms an emitter of the protective device 24 and a source for the MOS diode 27. A third diffused region 33 of the second conductivity type forms a drain of the MOS diode 27. An insulating layer 32' overlies the substrate 26' and includes a thin oxide layer 42' overlying a collector-base junction 44'. Openings 34' and 38' are made in the layer 32' to permit electrical contact to be made to the regions 30' and 31. A further opening 35 is formed in the layer 32' to permit contact to be made to the region 33.

FIG. 3D shows a first metal electrode 60 formed on the layer 32'. The electrode 60 forms contact 62 to the drain of the device 27 and overlies the thin oxide layer 42'. A second metal electrode 64 is formed on the layer 32' to form a contact 66 to both emitter and source of the devices 24 and 27, respectively. The electrode 64 also forms a contact 69 to the substrate 26' through an opening 68 in the layer 32'. A metal electrode 49' is formed on the layer 32' and provides a contact 36' to the collector region 30' of the device 24. The electrode 49' is also connected to the input terminal (I) at the node 21 as shown in FIG. 1A.

The gated diode 24 in FIGS. 3C and 3D employs an electrically altered junction 45', as will appear hereinafter, to lower the breakdown voltage of the gated diode 24 to over voltages. Currents are shorted to substrate or a reference supply when operational, as described in conjunction with FIG. 1A. The MOS diode 27 improves the clamping action of the electrode 60 to substrate relative to the structure of FIG. 1A.

In the absence of a high impedance element 25 or the MOS diode 27, the high voltage stress across the junctions 44 or 44' causes premature failure of the device 24 at 45 or 45', respectively. Experience indicates that the protected device 12 of FIG. 1A may be operative but the short circuit condition through the protective device renders the device 12 inoperative. Altering the metallurgical junction near the substrate surface to improve breakdown voltage has been found to reduce the failure modes of the protecting device 24.

Figure 4:
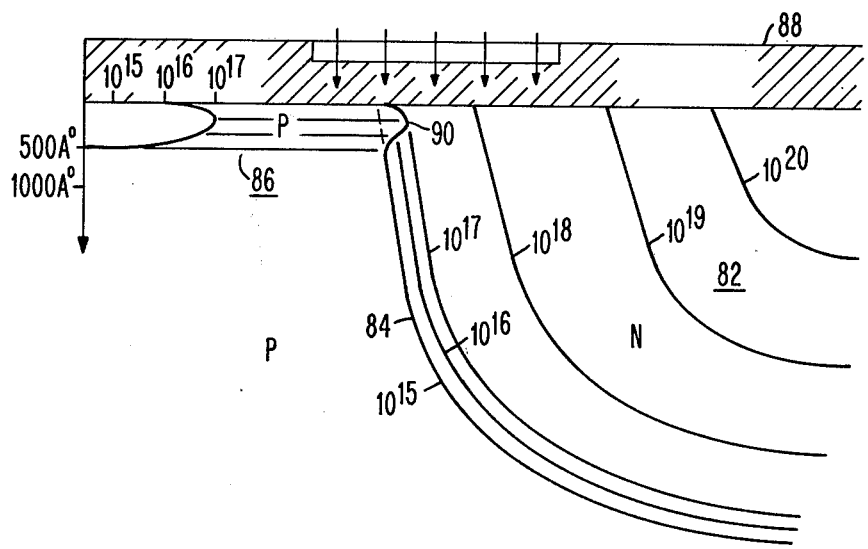
FIG. 4 is a graph of a p/n junction in a substrate showing impurity concentration in atoms per $cm^3$ for a diffused region and ion implant impurity concentration versus thickness in angstroms of the substrate.

The profile of a metallurgical junction in a semiconductor device may be altered by several techniques. One technique is the use of an ion implant along a diffused junction. FIG. 4 shows a diffused region 82 and a metallurgical junction 84 formed in a p type substrate. The diffused region has an impurity profile that varies from a doping concentration of $10^{15}$ to $10^{20}$ donor atoms per cm$^3$. Introduction of an ion implant region 86 into the p type substrate through an oxide layer 88 permits alteration of the junction 84. The ion implant may be localized in area and depth relative to the diffused region by well known techniques. In one form, the implant varies from $10^{15}$ to $10^{17}$ acceptor atoms per cm$^3$ from a depth of 500A to the surface of the substrate. The intersection of the implant profile and the diffused profile alters the metallurgical junction to have a sharp profile 90 near the surface of the substrate. The junction 84 is similar to the electrically altered junction 45 or 45' obtained with the metal electrodes 49 or 60 in FIGS. 2A or 3C, respectively. The junction profile 90 may be adjusted to a particular breakdown voltage by proper selection of implant parameters. The breakdown voltage may be made independent of the circuit and process parameters for the circuit to be protected.

Figure 1C:
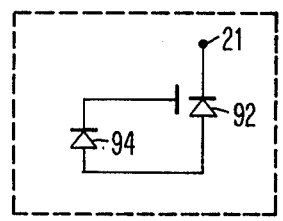
FIG. 1C is an electrical schematic of still another protective circuit including a p/n diode tailored to provide a preselected breakdown voltage for the circuit and an impedance to prevent current flow through the oxide of the diode.

FIG. 1C shows a p/n diode 92 connected as a protective device for the circuit 10 of FIG. 1A. The breakdown voltage of the diode 92 is adjusted to be less than the breakdown voltage for the circuit 12 by selection of an ion implant of appropriate dosage. Normally, the implant is made through a thin oxide layer. Subsequently, the thin oxide layer is eliminated during oxide regrowth cycles in processing the semiconductor. The regrowth cycle can diffuse the implant and reduce the curvature of the junction 90. However, an electrode may be formed over the junction 90 to restore the curvature. The electrode is connected to one side of a diffused diode 94, the other side of the diode is connected to the substrate. The diode 94 leaks charges to the substrate. The charges can accumulate on the plate and constitutes a hazard to the oxide. But the diode 94 provides a high impedance to prevent premature breakdown of the diode 92. However, the implant makes the need of a field shield less important than heretofore as a mechanism for reducing the breakdown voltage of a junction.

Figure 5A:
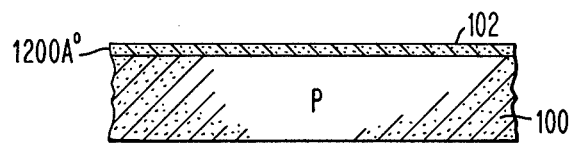
FIGS. 5A – 5E show a flow diagram for fabricating the protective circuit of FIG. 1C.
Figure 5B:
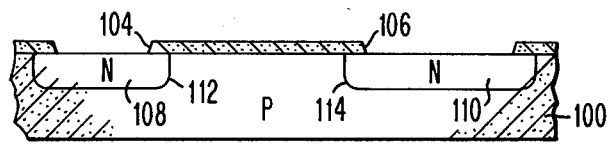
Figure 5C:
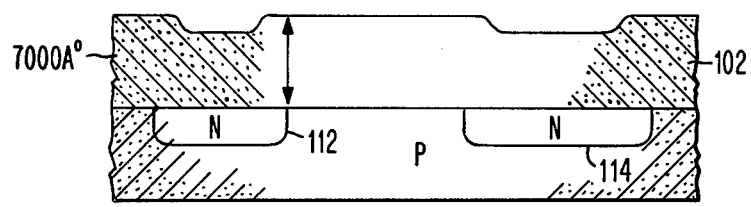
Figure 5D:
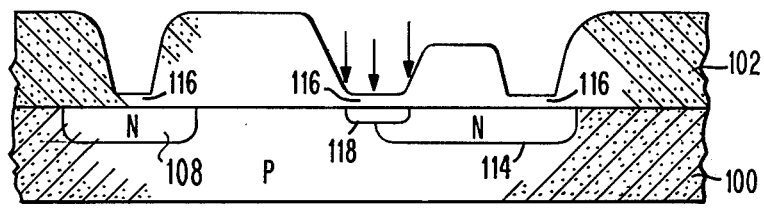
Figure 5E:
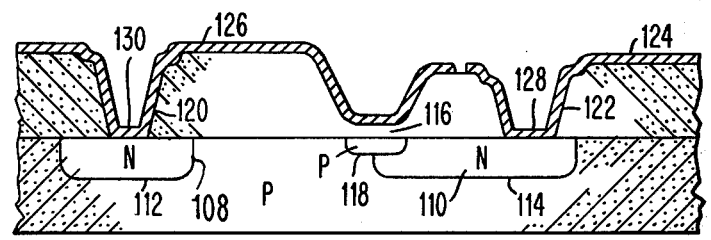
Figure 5F:
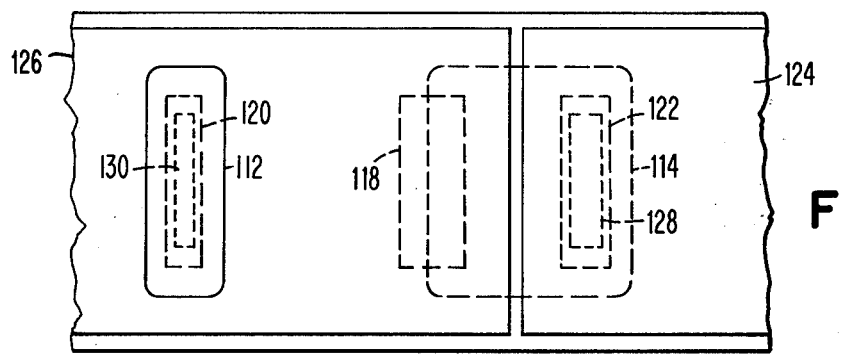
FIG. 5F is a plan view of FIG. 5E.

FIGS. 5A through 5F show a flow diagram for fabricating the over voltage protective circuit shown in FIG. 1C. The protective circuit is formed in a substrate 100 of a first conductivity type using conventional diffusion, metallization and ion implantation processes. As a first step, an insulating layer 102, typically silicon dioxide or the like is formed on the substrate 100, as shown in FIG. 5A. The layer 102 is formed to a thickness of approximately 1200A by well known thermal or other oxide growth processes. Openings 104 and 106 are formed in the layer 102 by well known photolithographic and etching processes, as shown in FIG. 5B. An impurity is vapor diffused or the like through the openings 104, 106 to establish diffused regions 108 and 110 and junctions 112 and 114, respectively. A thermal oxide regrowth process is performed on the layer 102 to achieve a thickness of approximately 7000A, as shown in FIG. 5C. A thin oxide layer 116 is formed about a portion or entirely along the junction 114. The oxide 102 is also thinned over the regions 108 and 110 where contacts are to be formed as shown in FIG. 5D. The layer 116 is formed by well known photolithographic-etching and oxide regrowth processes as employed in fabricating metal gate transistors. The area about the layer 116 is suitably masked in preparation for the installation of an ion implant region 118 in the substrate 100. The ion implant region 118 is installed in the substrate by conventional ion implanting apparatus operated at en energy of 150 Kev at a dosage of $10^{13}$ions-cm$^2$. In FIG. 5E, contact openings 120 and 122 are formed over the regions 108 and 110, respectively by conventional photolithographic-etching processes. A first metal electrode 124 and a second metal electrode 126, typically aluminum are simultaneously formed on the layer 102 by well known metallization processes. The electrode 124 forms a contact 128 to the diffused region 110 and also connects to the node 21, described in FIG. 1A. The junction 114 serves as the protective diode 92 previously described in FIG. 1C. The breakdown voltage at the junction 114 is tailored by the parameters of the ion implant 118, as previously described in conjunction with FIG. 4. The metal electrode 126 forms a contact 130 to the diffused region 108. The junction 112 functions as a protective diode 94 for the diode 92. Essentially, the diode 94 provides a high impedance to prevent electrostatic discharge currents flowing through the layer 116. FIG. 5F shows additional details of the structure shown in FIG. 5E.

Figure 6A:
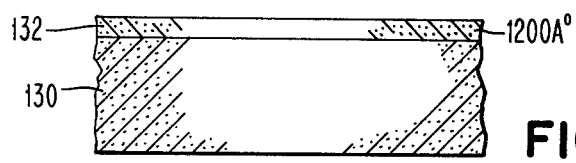
FIGS. 6A – 6G show a flow diagram for fabricating a p/n junction as a protective device that has a tailored metallurgical junction by means of an ion implant.
Figure 6B:
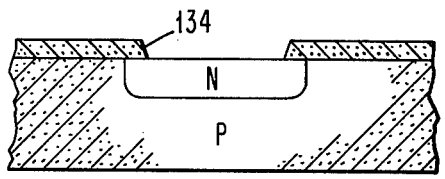
Figure 6C:
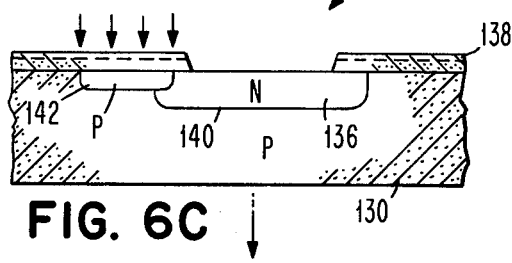
Figure 6F:
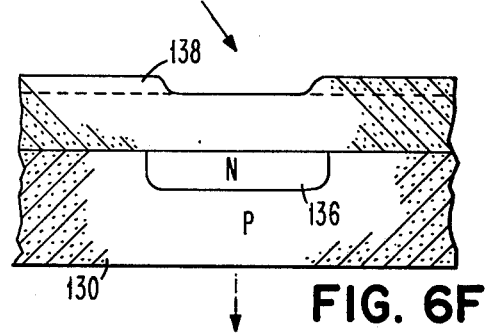
Figure 6D:
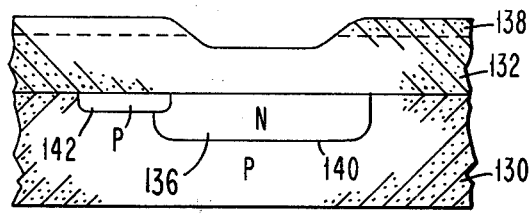
Figure 6G:
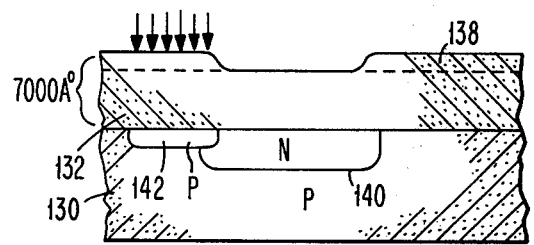
Figure 6E:
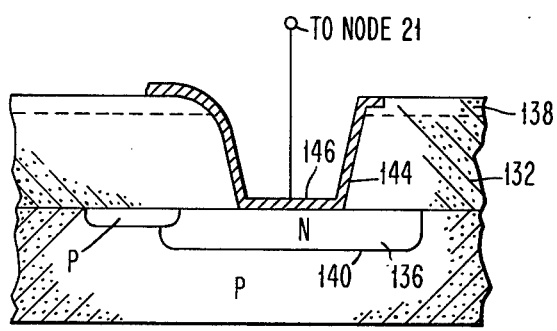

FIGS. 6A through 6G show the formation of a protective diode without a high impedance element 94. The protective diode 92 is formed in a substrate 130 of a first conductivity type. An insulating layer 132 is formed on the surface to a thickness of approximately 1200A, as shown in FIG. 6A. An opening 134 is formed in the layer 132 by conventional photolithographic-etching processes, as shown in FIG. 6B. A diffused region 136 is formed under the opening 134 by diffusing into the substrate an impurity of a second conductivity type. Typically, the substrate is of an p conductivity type and the diffused region is of a n conductivity type. The element phosphorus is diffused into the substrate 130 from a compound of phosphorus pentoxide or phosphorus oxytrichloride. The phosphorus diffusion forms a phosphosilicate layer 138 on the surface of the layer 132, as shown in FIG. 6C. The phosphorus diffusion also forms a metallurgical junction 140 about the opening 134. The junction 140 may be tailored to a particular breakdown voltage by an ion implant 142 performed before a thermal regrowth process. Performing the ion implant before thermal regrowth of the layer 132 permits the ion implant apparatus to be operated at a lower field strength than after a thermal regrowth step. However, the subsequent thermal regrowth after an ion implant step, alters the metallurgical junction 140 and changes the breakdown voltage of the diode, as shown in FIG. 6D. In contrast, performing the ion implant after a thermal regrowth process as shown in FIG. 6F, prevents lowering of the breakdown voltage of the junction 130. However, the ion implant apparatus must be operated at an elevated energy of the order of 300 Kev to install the implant under the layer 132, as shown in FIG. 6G. An opening 144 is formed in the layer 132 to permit the formation of a contact. A metal electrode 146 is formed on the layer 132 and extends into the opening 144 to establish a contact 146 to the region 136.

The phospho-silicate glass layer 138 performs a function similar to that of the metal electrode 126 of FIG. 5E. The layer 138 getters charges in the layer 132 which could weaken the oxide after drifting through the layer.

Figure 7A:
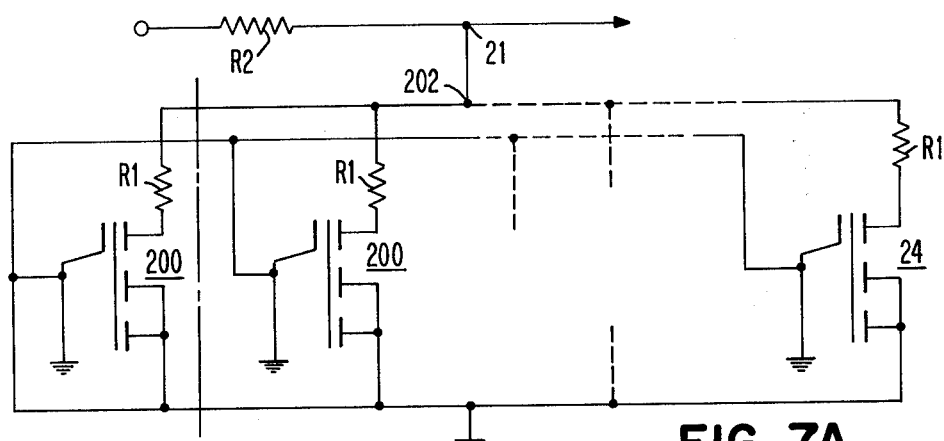
FIG. 7A is an electrical schematic of a circuit connected to a protective device (not shown) and adapted to limit or control secondary breakdown current in the protective device.
Figure 7B:
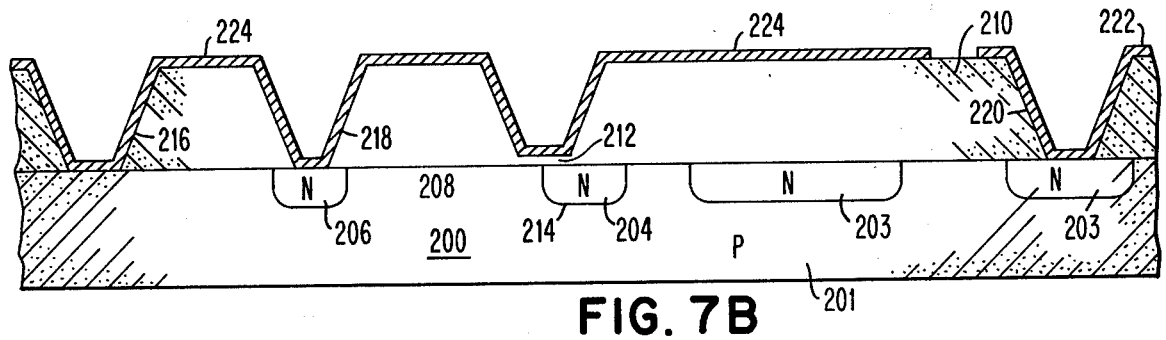
FIG. 7B is a cross sectional view of a semiconductor including a branch of the circuit of FIG. 7A.
Figure 7C:
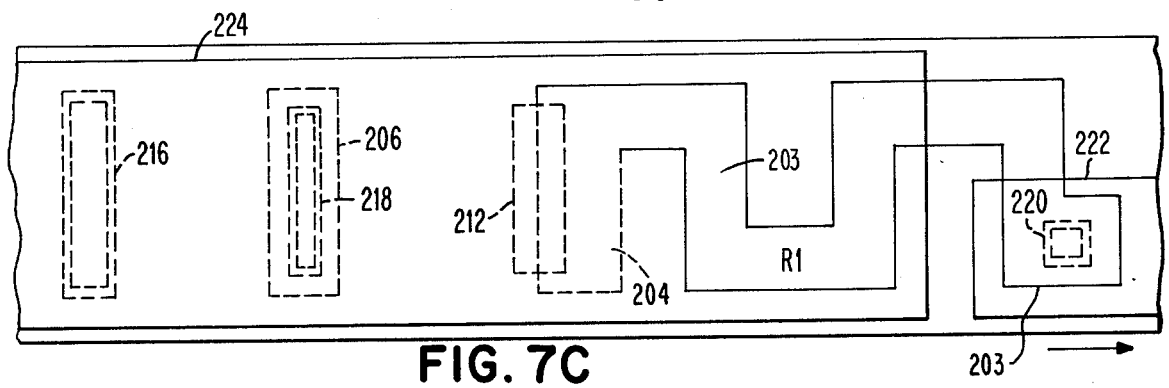
FIG. 7C is a plan view of FIG. 7B.

FIGS. 7A through 7C show a protective device further improved to lessen and/or control secondary breakdown. Avalanching is a normal breakdown mechanism of a diffused diode and/or gated diode. Thermal hot spots occur along an avalanching junction due to non-uniform avalanching. Junction resistance at these hot spots decreases. Breakdown currents funnel to these spots while the remainder of the junction stops avalanching. The temperature at these spots becomes very high while the remainder of the junction becomes cooler. The conducting spots emit an intense red light. Temperatures of the order of 600° C to 1000° C have been reported in technical literature relative to secondary breakdown effects.

In FIG. 3A, the diode begins to conduct in an avalanching mode at approximately 32 volts. Once the diode voltage exceeds 42 volts, switching of the diode to a lateral transistor conducting mode occurs at approximately 20 volts. Non-uniform conduction along the junction is indicated by the gaps in the plot. Junction current funnels to the conducting spots with a corresponding reduction of the voltage ~20 volts across the junction. The high current flow at the conducting spots results in destruction of the diode. Normal practice in the art to prevent excessive heating during avalanching is to extend the periphery of the junction beneath the oxide. The larger the junction periphery, the lower the power dissipation per unit length along the periphery and the less the heating. However, when secondary breakdown does occur at one or more junction locations, a large junction periphery serves no useful purpose. One alternative for reducing secondary breakdown is to limit the current flow through the junction by means of an impedance, typically an input resistor. The input resistor, however, may lower circuit performance. An alternative for controlling secondary breakdown without affecting circuit performace is shown in FIG. 7A. The junction for a protective device is divided into $n$ sections where $n$ is any integer. Each section consists of a series resistor or R1 and a gated diode 200. The respective circuits are connected in parallel at a node 202 which is in turn connected to the node 21 of the protected circuit. An input resistor R2 may be connected in the circuit to further limit the current flow if the performance of the protected circuit is not adversely affected. An electrostatic discharge current is uniformly distributed among the parallel branches of FIG. 7A. Resistors R1 limit current flow through each branch to prevent secondary breakdown effects. In the event that secondary breakdown does occur at one or more of the junctions of the protective device, the circuit of FIG. 7A prevents funneling of all discharge current to that location. Each branch of the circuit of FIG. 7A continues to conduct in the face of seconary breakdown at one or more of the junctions thereby limiting current flow at that location and thus destruction of the protective device.

FIGS. 7B and 7C show one branch of the circuit of FIG. 7A. The resistor R1 is formed in a substrate 201 by an extended diffusion path 203 which connects to a collector region 204 which is included in the gated diode 200. An emitter diffusion 206 is also formed in the substrate 201. A region 208 between the regions 204 and 206 functions as the base of the gated diode. An insulating layer 210 overlies the substrate 201 and includes a thin oxide layer 212 over a portion of all of the junction 214 surrounding the collector region 204. The layer 210 includes openings at 220, 218 and 216 for contact to the resistor 203, the emitter 206 and the substrate 201, respectively. A metal electrode 222 connects the resistor to the common node 202 of the protective device. An electride 224 contacts the emitter 206 and the substrate 201 as well as overlying the thin oxide layer 212.

Electrostatic discharge current appearing at the node 202 is equally distributed among the branches of the circuit of FIG. 7A. Each resistor R1 limits the flow of current through the protective diode 24. The structure of FIGS. 7B and 7C can be fabricated in a manner similar to that described for FIGS. 5A through 5F.

While the invention has been particularly described with reference to preferred embodiment thereof, it is readily apparent to a worker skilled in the art that other forms and materials may be utilized in the invention without departing from the spirit and scope thereof.

What is claimed is:

1. A process for fabricating a semiconductor device comprising the steps of:
   a. forming an insulating layer on a planar surface of a semiconductor substrate of a first type and degree of conductivity;
   b. opening a hole in said insulating layer and diffusing doping impurities therethrough into said substrate to form a first region of a second type and higher degree of conductivity with its p/n metallurgical junction having a first profile with a first radius of curvature intersecting said planar surface;
   c. forming a second region of a first type and equal or higher degree of conductivity in said first region, contiguous with the substrate and forming a sharp profile in said first profile of said p/n metallurgical junction, having a second radius of curvature less than said first radius of curvature;
   d. said first region having a junction breakdown voltage determined by said sharp profile in said metallurgical p/n junction, and;
   e. attaching an electrode to said first region.

2. The process of claim 1 wherein the second region is formed by an ion implant.

3. The process of claim 2 wherein a gettering layer is formed over the insulating layer after ion implantation.

4. The process of claim 1 wherein the second region is formed by implanting through a thin insulating layer.

5. The process of claim 1 wherein said second region is formed by ion implanting through a thick insulating layer.

6. The process of claim 1 wherein the area of the first conductivity type along the p/n junction extends into the region of second conductivity type.

7. A process for fabricating an over voltage protective device comprising the steps of:
   a. forming an insulating layer on a planar surface of a semiconductor substrate of a first type and degree of conductivity;
   b. opening two holes in said insulating layer and diffusing doping impurities therethrough into said substrate to form first and second regions of a second type and higher degree of conductivity with their p/n metallurgical junctions having first profiles with a first radius of curvature intersecting said planar surface;
   c. reforming said insulating layer in and outside said two holes with a relatively thick insulating layer;
   d. opening three holes in said thick insulating layer, the first of said holes disposed at least over a portion of said intersection between the planar surface and said first profile of the p/n junction of said first region, the second of said holes disposed over said first region and spaced from said first hole and the third hole disposed over said second region;
   e. reforming the insulating layer in each one of said three holes to a preselected thin thickness;
   f. forming a third region of a first type and of equal or higher degree of conductivity in said first region, contiguous with the substrate and forming a sharp profile in said first profile of said p/n metallurgical junction, having a second radius of curvature less than said first radius of curvature;
   g. removing said thin insulating layer from said second and third holes,
   h. forming a first electrode on said thin insulating layer covering said first hole and extending over said thick insulating layer to cover said third hole to make electrical contact with said second region, and;
   i. forming a second electrode covering said second hole to make electrical contact with said first region and extending over said thick insulating layer to form the gate electrodes of the insulated gate transistors to be protected against electrostatic discharges applied between this second electrode and said semiconductor substrate.

8. The process of claim 7 wherein said region of first conductivity type is formed by ion implantation through said insulating layer of preselected thickness.

9. A process for fabricating an over voltage protective device comprising the steps of:
   a. forming an insulating layer on a planar surface of a semiconductor substrate of a first type and degree of conductivity;
   b. opening two holes in said insulating layer and diffusing doping impurities therethrough into said substrate to form first and second regions of a second type and higher degree of conductivity with their p/n metallurgical junctions having profiles with a radius of curvature intersecting said planar surface;
   c. forming said insulating layer in and outside said two holes with a relatively thick insulating layer;
   d. opening three holes in said thick insulating layer, the first of said holes disposed at least over a portion of said intersection between the planar surface and said profile of the p/n junction of said first region, the second of said holes disposed over said first region and spaced from said first hole and the third hole disposed over said second region;
   e. reforming the insulating layer in each one of said three holes to a preselected thin thickness;
   f. removing said thin insulating layer from said second and third holes;
   g. forming a first electrode on said thin insulating layer covering said first hole and extending over said thick insulating layer to cover said third hole and make electrical contact with said second region, and;
   h. forming a second electrode covering said second hole to make electrical contact with said first hole and extending over said thick insulating layer to form the gate electrodes of the insulated gate transistors to be protected against electrostatic discharges applied between this second electrode and said semiconductor substrate.

* * * * *